US009536700B2

(12) United States Patent
Goto et al.

(10) Patent No.: US 9,536,700 B2
(45) Date of Patent: Jan. 3, 2017

(54) SAMPLE OBSERVATION DEVICE

(71) Applicant: Hitachi High-Technologies Corporation, Minato-ku, Tokyo (JP)

(72) Inventors: Yasunori Goto, Tokyo (JP); Takuma Yamamoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/786,039

(22) PCT Filed: Apr. 17, 2014

(86) PCT No.: PCT/JP2014/060889
§ 371 (c)(1),
(2) Date: Oct. 21, 2015

(87) PCT Pub. No.: WO2014/175150
PCT Pub. Date: Oct. 30, 2014

(65) Prior Publication Data
US 2016/0071688 A1   Mar. 10, 2016

(30) Foreign Application Priority Data
Apr. 22, 2013   (JP) ................................ 2013-089564

(51) Int. Cl.
*G01N 23/00*   (2006.01)
*H01J 37/22*   (2006.01)
(Continued)

(52) U.S. Cl.
CPC .............. *H01J 37/222* (2013.01); *H01J 37/22* (2013.01); *H01J 37/28* (2013.01);
(Continued)

(58) Field of Classification Search
CPC .......... H01J 37/00; H01J 37/02; H01J 37/045; H01J 37/222; H01J 37/226; H01J 37/244; H01J 37/26; H01J 37/261
(Continued)

(56) References Cited

U.S. PATENT DOCUMENTS

| 6,366,688 | B1 | 4/2002 | Jun et al. | |
| 2001/0022345 | A1* | 9/2001 | Ishimoto | G01N 23/00 250/307 |

(Continued)

FOREIGN PATENT DOCUMENTS

| JP | 2000-58608 A | 2/2000 |
| JP | 2004-235464 A | 8/2004 |
| JP | 2009-266839 A | 11/2009 |

OTHER PUBLICATIONS

International Search Report (PCT/ISA/210) issued in PCT Application No. PCT/JP2014/060889 dated Jul. 22, 2014 with English translation (three pages).

(Continued)

Primary Examiner — Jason McCormack
(74) Attorney, Agent, or Firm — Crowell & Moring LLP

(57) ABSTRACT

Provided is a sample observation apparatus including a charged particle optical column that irradiates a sample including an observation target portion that is a concave portion with a charged particle beam at an acceleration voltage, an image generation section that acquires an image including the observation target portion from a signal acquired with irradiation of the charged particle beam, a storage section that stores information representing a relationship between a brightness ratio of a concave portion and its neighboring portion of a reference sample that is irradiated with the charged particle beam at the acceleration voltage and a value that represents a structure of the concave portions of the reference sample in advance, a calculation (Continued)

section that acquires a brightness ratio of the concave portion and its neighboring portion of the image, and a determination section that determines whether or not a defect occurs in the observation target portion based on the information that represents the relationship and the brightness ratio of the image.

14 Claims, 18 Drawing Sheets

(51) Int. Cl.
    *H01J 37/28*     (2006.01)
    *H01L 21/66*     (2006.01)

(52) U.S. Cl.
    CPC ... *H01J 2237/221* (2013.01); *H01J 2237/281* (2013.01); *H01J 2237/2815* (2013.01); *H01L 22/12* (2013.01)

(58) Field of Classification Search
    USPC ........ 250/306, 307, 311, 492.1, 492.2, 492.3
    See application file for complete search history.

(56) References Cited

U.S. PATENT DOCUMENTS

| | | | |
|---|---|---|---|
| 2006/0071166 A1* | 4/2006 | Sato | H01J 37/21 250/310 |
| 2011/0163230 A1* | 7/2011 | Hiroi | H01J 37/20 250/310 |
| 2012/0112066 A1* | 5/2012 | Ogiso | G06T 7/001 250/307 |

OTHER PUBLICATIONS

Japanese-language Written Opinion (PCT/ISA/237) issued in PCT Application No. PCT/JP2014/060889 dated Jul. 22, 2014 (three pages).

* cited by examiner

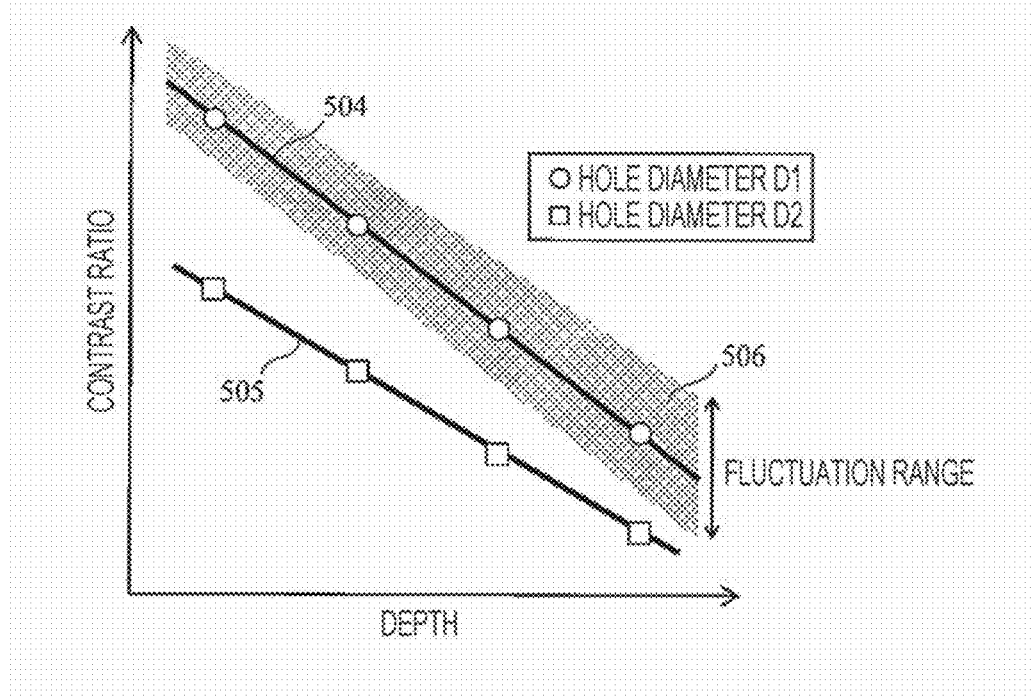

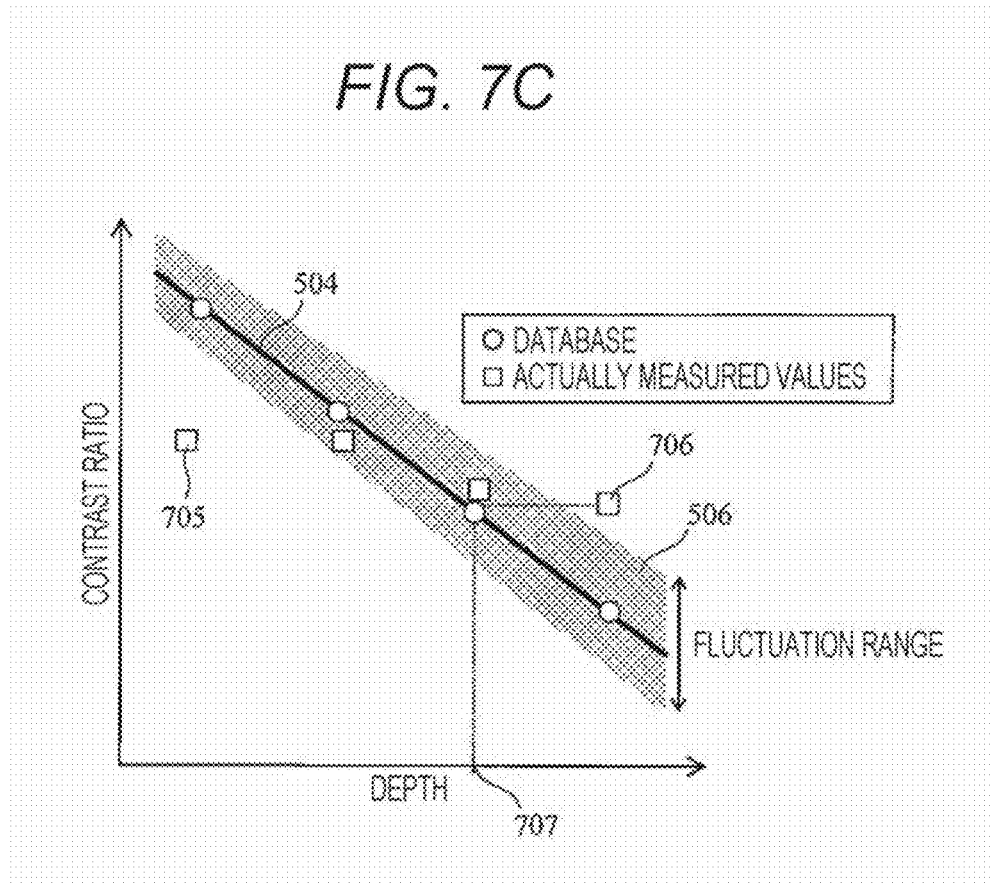

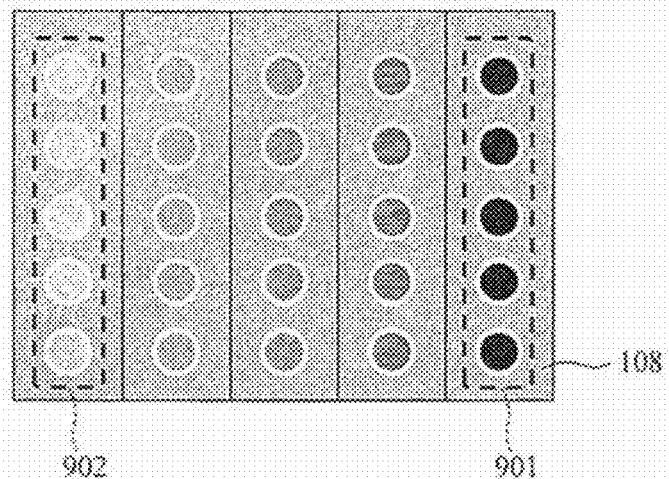
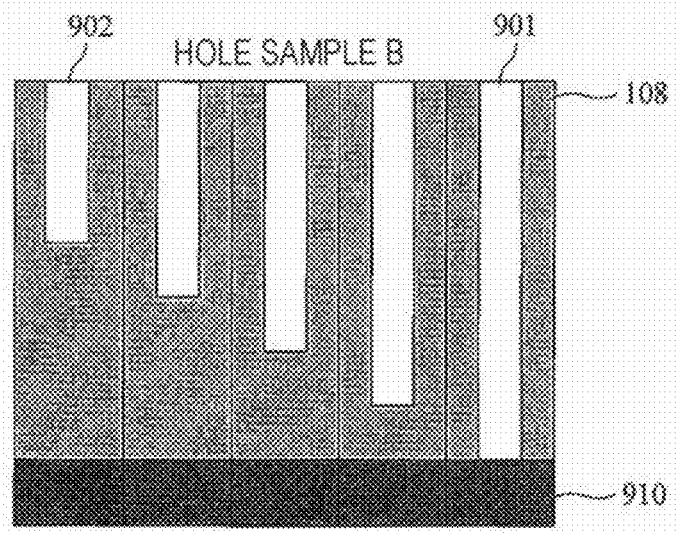

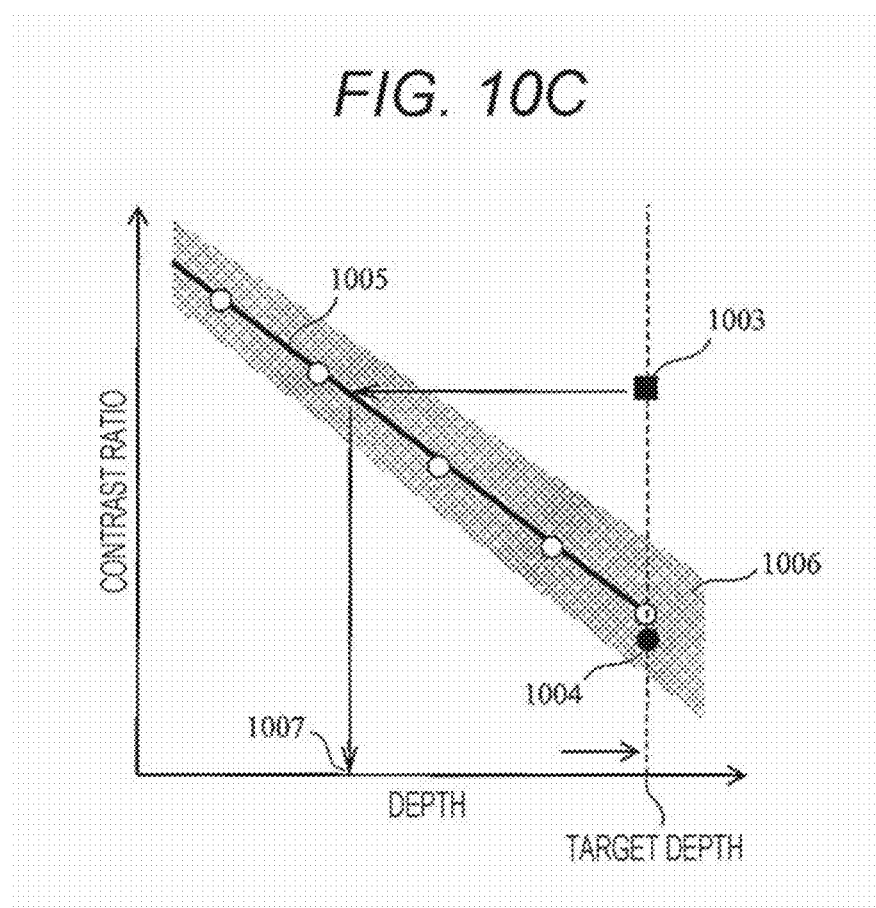

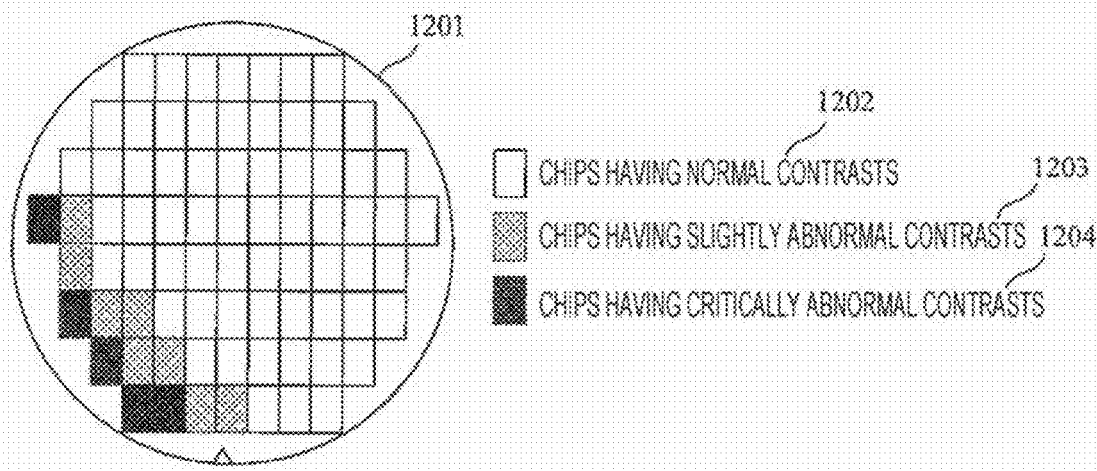

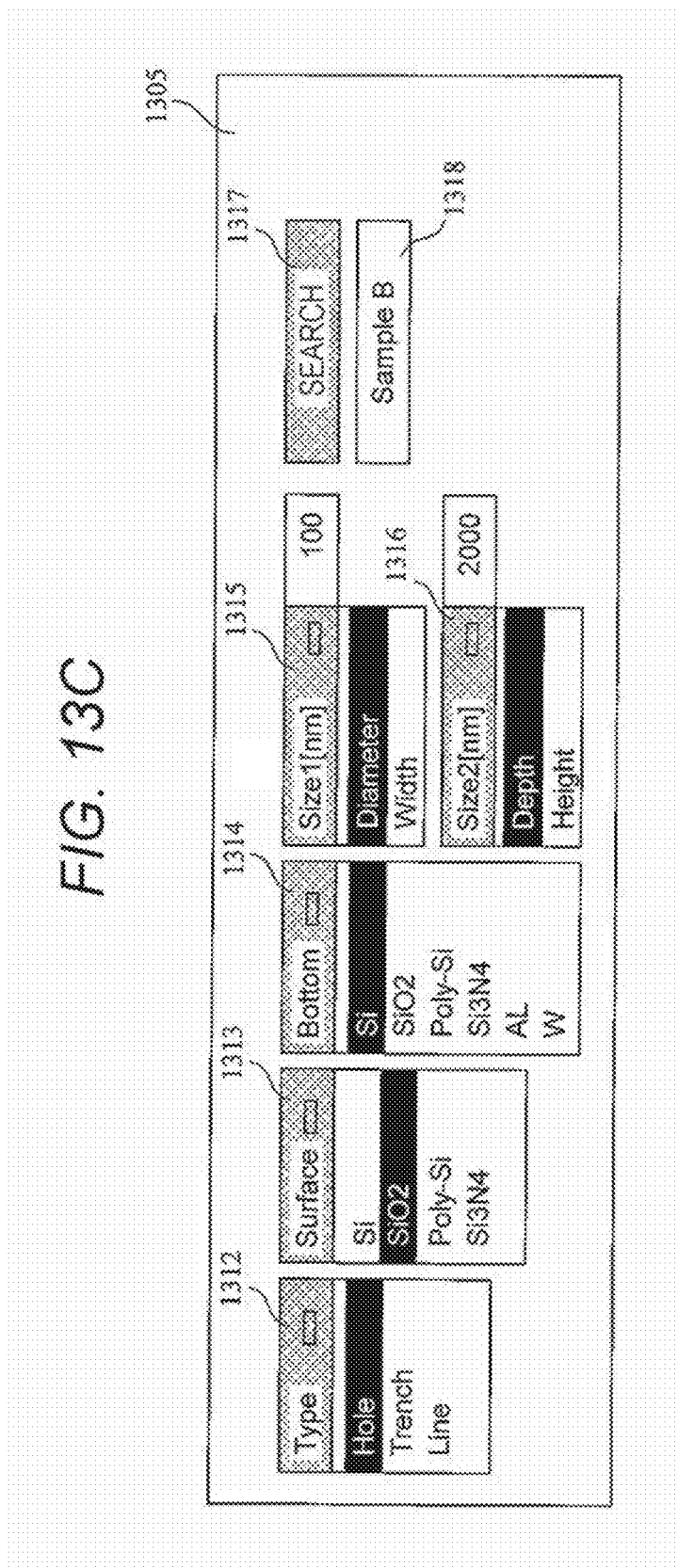

SAMPLE OBSERVATION DEVICE

TECHNICAL FIELD

The present invention relates to sample observation apparatus.

BACKGROUND ART

Conventionally, semiconductor devices have been miniaturized so that they have large capacity and high integration. However, in the generation of 10 nm design rule, since the difficulty of exposure is bottlenecked, the miniaturization of semiconductor devices has slowed down. Semiconductor manufacturers have provided three-dimensional laminate devices instead of plane devices so as to accomplish large capacity semiconductor devices instead of depending on miniaturization.

Since three-dimensional devices are laminated, their thickness becomes greater than that of conventional devices. Thus, a problem in manufacturing three-dimensional devices is to treat thick laminate structures. Since a treatment aspect ratio (the ratio of a plane size of a hole or a trench and its depth) is greater than that of a conventional structure, an etching treatment for holes or trenches would become very difficult. In addition, techniques for evaluating and inspecting three-dimensional devices are becoming important to improve development turn around time (TAT).

Etching of contact holes is evaluated in such a manner that after an etching rate of a bear wafer is evaluated, etching time is calculated based on the acquired data, and then treatment time is estimated. For etching, an analysis of plasma light emission is performed in real time and a final etching result is analyzed and determined. However, in laminate structures of three-dimensional devices, etching rates depend on individual films. The thickness of each film is as small as around 100 nm. Their final determination for etching treatment would become difficult. Conventionally, when it is determined whether contact holes of a sample are open/not open, since it needs to be fractured so as to analyze its cross-section, TAT would deteriorate.

As an evaluation of a pattern treatment result using an electron microscope technique, PTL 1 discloses a technique, a microstructure of a bottom portion of a hole having a large aspect ratio is analyzed with a substrate current so as to estimate the film thickness of a residual film that is present at the bottom portion of the hole. However, if a pattern is present in a lower layer, it becomes difficult to measure the substrate current and since the thickness of the residual film is limited, this evaluation technique is difficult to be applied to the treatment result evaluation for an etched pattern.

CITATION LIST

Patent Literature

PTL 1: JP 2004-235464 A.

SUMMARY OF INVENTION

Technical Problem

On the other hand, as a treatment result evaluation for a pattern using an electron microscope technique, SEM wafer inspection apparatus is also known. The SEM wafer inspection apparatus can detect differences of charged potentials of the opening portions/non-opening portions formed with irradiation of an electron beam. However, since an acceleration voltage used for the SEM wafer inspection apparatus is at most around 5 kV, primary electrons do not reach a bottom portion of a sample having a depth of 2 μm or greater. Even if primary electrons reach the bottom portion, since energy of secondary electrons that are emitted from bottoms of holes is as weak as several eV, they do not return to a detector. Thus, it is difficult to inspect contact holes having a deep structure.

The present invention is made in view of the foregoing circumstances, and an object of the present invention is to provide sample observation apparatus that can evaluate a treatment result of a three-dimensional device having a deep structure.

Solution to Problem

To solve the foregoing problems, structures described in claims are used, for example. The present application contains a plurality of means that solve the foregoing problems, and examples thereof include a sample observation apparatus including a charged particle optical column that irradiates a sample including an observation target portion that is a concave portion with a charged particle beam at an acceleration voltage, an image generation section that acquires an image including the observation target portion from a signal acquired with irradiation of the charged particle beam, a storage section that stores information representing a relationship between a brightness ratio of a concave portion and its neighboring portion of a reference sample that is irradiated with the charged particle beam at the acceleration voltage and a value that represents a structure of the concave portions of the reference sample in advance, a calculation section that acquires a brightness ratio of the concave portion and its neighboring portion of the image, and a determination section that determines whether or not a defect occurs in the observation target portion based on the information that represents the relationship and the brightness ratio of the image.

Another example provides a sample observation apparatus including a charged particle optical column that irradiates a sample including an observation target portion that is a concave portion with a charged particle beam at an acceleration voltage, an image generation section that acquires an image including the observation target portion from a signal acquired with irradiation of the charged particle beam, a storage section that stores information representing a relationship between a brightness ratio of a concave portion and its neighboring portion of a reference sample that is irradiated with the charged particle beam at the acceleration voltage and a value that represents a structure of the concave portions of the reference sample in advance, a calculation section that acquires a brightness ratio of the concave portion and its neighboring portion of the image, and a determination section that determines whether or not treatment conditions for the observation target portion are appropriate based on the information representing the relationship and the brightness ratio of the image.

Another example provides a sample observation apparatus including a charged particle optical column that irradiates a sample including an observation target portion that is a concave portion with a charged particle beam at an acceleration voltage, an image generation section that acquires an image including the observation target portion from a signal acquired with irradiation of the charged particle beam, a storage section that stores information representing a relationship between a brightness ratio of a concave portion and its neighboring portion of a reference sample that is irradiated with the charged particle beam at the acceleration voltage and a value that represents a structure of the concave portions of the reference sample in advance, a calculation section that acquires a brightness ratio of the concave portion and its neighboring portion of the image, and a display section that displays the information that represents the relationship as a graph. In the sample observation apparatus, the brightness ratio of the image is indicated on the graph.

Advantageous Effect of Invention

According to the present invention, a treatment result of a sample having a deep structure such as a three-dimensional device can be determined.

Further features of the present invention will become apparent from the description of the specification and the accompanying drawings. The problems, structures, and effects other than those described above will become clear from the description of the following embodiments.

BRIEF DESCRIPTION OF DRAWINGS

FIG. 5B is an example of a graph showing a relationship between depths and brightness ratios (contrast ratios) of the hole sample A.

FIG. 7C is an example of a comparison of contrast ratios calculated for individual holes shown in FIG. 7A and the graph shown in FIG. 5B.

FIG. 9A is an example of an SEM image of a hole sample B (reference sample).

FIG. 9B is a diagram showing a cross-sectional structure of the hole sample B (reference sample).

FIG. 10C is an example of plotting of contrast ratios on a graph corresponding to images shown in FIG. 10A and FIG. 10B.

FIG. 12A is an example of a map showing differences of contrast ratios of individual chips.

FIG. 12B is another example showing differences of contrast ratios of individual chips.

FIG. 13C is an enlarged view of a device structure information area shown in FIG. 13A

DESCRIPTION OF EMBODIMENTS

Next, with reference to the accompanying drawings, embodiments of the present invention will be described. Although these drawings show specific embodiments based on the theory of the present invention, they are provided for understanding of the present invention. Thus, these drawings should not be used for limitedly interpreting the present invention.

As a typical example of sample observation apparatus, charged particle beam tracing apparatus that scans the surface of a sample with a charged particle beam and uses secondarily generated electrons is known. As a typical example of the charged particle beam apparatus, a scanning electron microscope (SEM) is known. The present invention can be applied to all types of scanning electron microscopes. For example, the present invention can be applied to a review SEM, a critical dimension (CD)-SEM, an overlay (OL)-SEM, SEM inspecting apparatus, a high acceleration SEM, and the like.

[First Embodiment]

Figure 1:
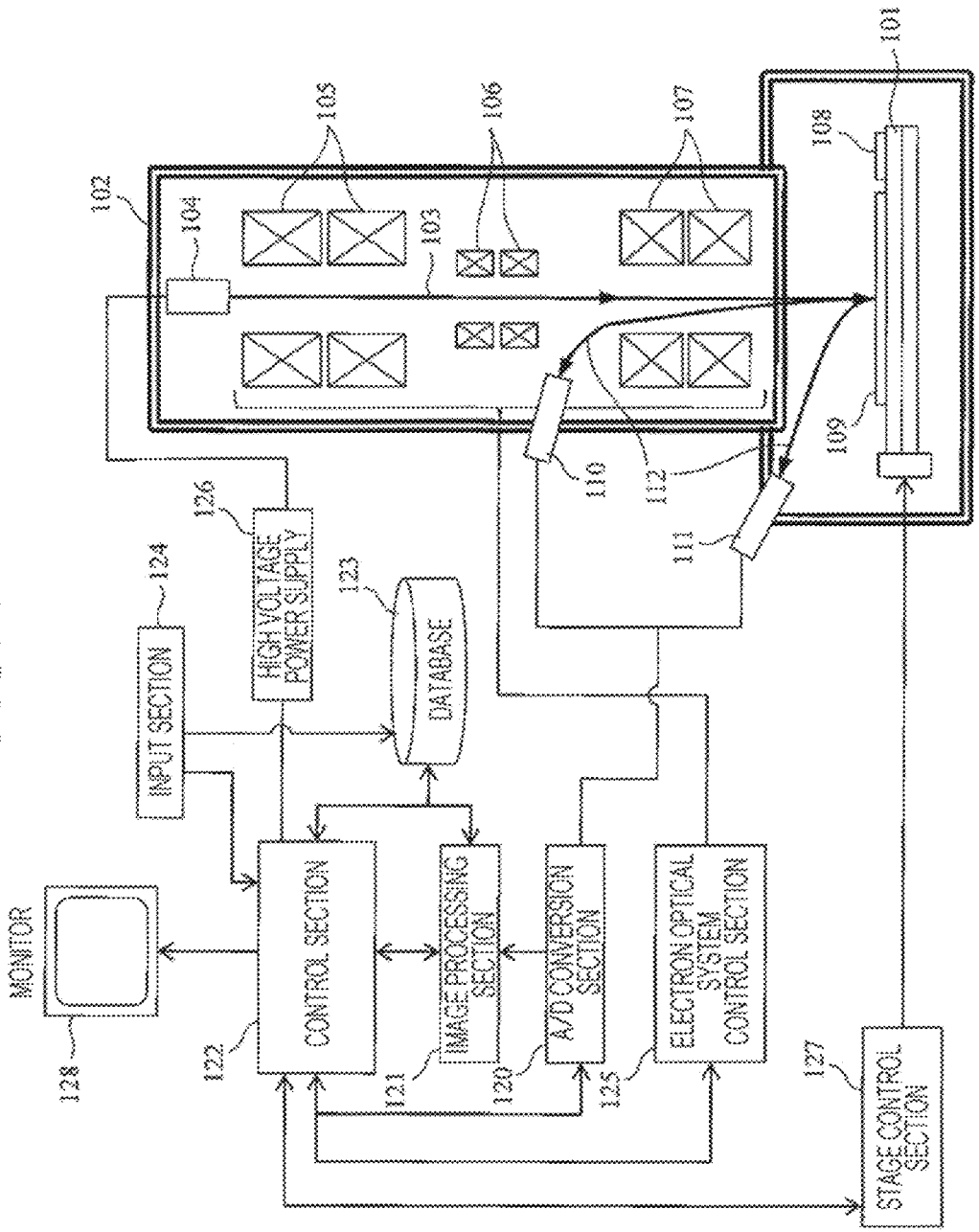
FIG. 1 is a diagram showing a scanning electron microscope according to the present invention.

FIG. 1 is a diagram showing a scanning electron microscope according to the present invention. The scanning electron microscope includes a column 102 that is an electron optical system. The column 102 includes an electron source 104, a condenser lens 105, a deflection scanning coil 106, and an objective lens 107 that compose an electron optical system, the electron optical system irradiating an object with an electron beam 103. In addition, the scanning electron microscope includes detectors 110 and 111. The detectors are not limited to the detectors 110 and 111.

The electron source 104 is composed of an electron gun having a cathode (not shown) that is kept at a negative high potential and an anode (not shown) disposed at an exit of an electron beam. In the electron source 104, a voltage applied between the cathode and anode of the electron gun can be changed. When the voltage of the electron source 104, referred to as an acceleration voltage, is changed, the electron source 104 emits accelerated electrons. The acceleration voltage can be changed according to one of two methods: the method in which the voltage applied to the electron source 104 is changed; and the method in which a negative voltage is applied to a sample stage 101 (referred to as the retarding method). The acceleration voltage may be changed according to any one of these two methods.

The scanning electron microscope includes the sample stage 101. An observation target sample 109 observed by the scanning electron microscope is moved to a sample chamber through a sample preparation chamber (not shown). Thereafter, the sample 109 is placed on the sample stage 101. In addition, a reference sample 108 is also placed on the sample stage 101. Details of the reference sample 108 will be described later. According to the present embodiment, both the sample 109 and the reference sample 108 are placed on the sample stage 101. However, the present invention is not limited to such a structure.

The electron beam 103 that is emitted from the electron source 104 is converged by the condenser lens 105. The electron beam 103 is deflected by the deflection scanning coil 106 so that the sample 109 placed on the sample stage 101 is scanned with the electron beam 103. In addition, the electron beam 103 is converged to the sample 109 placed on the sample stage 101 by the objective lens 107. The sample 109 is irradiated and scanned with the electron beam 103.

When the sample 109 is irradiated with the electron beam 103, secondary charged particles 112 such as secondary electrons and reflected electrons that have information of the sample 109 are emitted therefrom. The secondary charged particles 112 are detected by the detectors 110 and 111. The A/D conversion section 120 digitizes outputs of the detectors 110 and 111. Thereafter, an image processing section 121 correlates scanning positions of the electron beam 103 with pixels so as to generate an image. An output of the image processing section 121 is sent to a monitor (display section) 128 through a control section 122 that controls the whole apparatus. The monitor 128 displays an SEM image of the sample 109. The SEM image that is output from the image processing section 121 is stored in a database 123.

The scanning electron microscope includes the control section 122, which controls the whole apparatus, an electron optical system control section 125 that controls the lenses 105 and 107, coil 106, and the like, which compose the foregoing electron optical system, and a stage control section 127 that controls the sample stage 101.

A user of the scanning electron microscope inputs predetermined parameters through an input section 124 such as an operation console. The input parameters are stored in the database 123. In addition, the parameters are sent to the control section 122 and the image processing section 121. The control section 122 sends a control signal to the electron optical system control section 125 and a high voltage power supply 126 so as to set imaging conditions of the SEM. Each structural element of the electron optical system is operated corresponding to the imaging conditions that have been set. In addition, the control section 122 controls the stage control section 127 based on observation coordinates corresponding to the parameters that have been input. The sample stage 101 is moved in X and Y directions under the control of the stage control section 127. In addition, the control section 122 controls the A/D conversion section 120 and the image processing section 121 so as to generate the foregoing SEM image.

The control section 122 and the image processing section 121 may be composed of hardware such as a dedicated circuit board. Alternatively, the control section 122 and the image processing section 121 may be accomplished by a general-purpose computer as functions of a program executed by the computer. In other words, processes of the control section 122 and the image processing section 121 may be stored as program codes in a storage section such as a memory. A processor such as a Central Processing Unit (CPU) may execute the program codes to accomplish the processes of the control section 122 and the image processing section 121.

The control section 122 may have a recipe generation section. A recipe is a program that describes a code of an operating condition of the scanning electron microscope and that defines an operation sequence including imaging conditions, coordinate information of an image acquisition position. The recipe generation section generates a recipe based on parameters (sample information, sample's coordinate information, and the like) and imaging conditions designated by an operator of the scanning electron microscope. As a result, the sequence of operations of the scanning electron microscope may be automatically executed.

Next, features of the present embodiment will be described. According to the present embodiment, the reference sample 108 including concave portions (holes, trenches, and the like) is observed by the scanning electron microscope. Here, "reference sample" has a plurality of concave portions having known different structures. In other words, the reference sample 108 is prepared so that concave portions have known widths and heights (plane sizes and depths). The reference sample 108 may be provided as a reference wafer.

According to the present embodiment, information (graph, numeric information, and the like) that represents relationship between brightness ratios of concave portions and their adjacent portions (front surface portions) of the reference sample 108 and values that represent structures of the concave portions of the reference sample 108 is prepared corresponding to a plurality of acceleration voltages. The prepared information is stored in the database 123 in advance. "Values that represent structures of concave portions" are depths, aspect ratios (ratios of planes size of concave portions and their depths), and the like.

Next, the sample 109 including concave portions (observation target portions) to be actually observed is observed by the scanning electron microscope at any acceleration voltage. The scanning electron microscope generates an image at the acceleration voltage and calculates brightness ratios of the concave portions and their neighboring portions. The scanning electron microscope retrieves information corresponding to the same acceleration voltage from the database 123. Thereafter, the scanning electron microscope compares the calculated brightness ratios with the information that represents the relationship and outputs the differences so as to determine whether the concave portions to be observed have defects.

Figure 2:
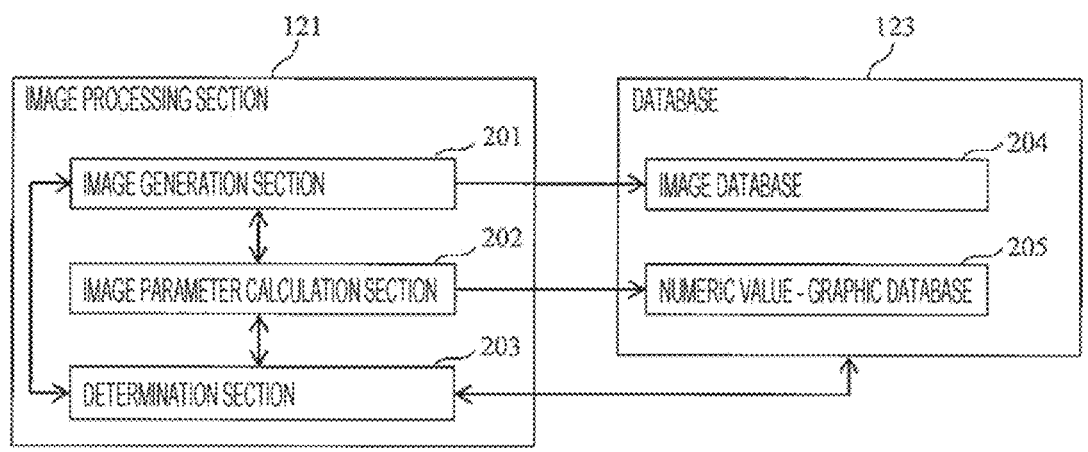
FIG. 2 is a diagram showing a structure of an image processing section and a database.

Next, the image processing section 121 and the database 123 will be described. FIG. 2 is a diagram showing a structure of the image processing section 121 and the database 123. The image processing section 121 includes an image generation section 201, an image parameter calculation section 202, and a determination section 203. The database 123 includes an image database 204 and a numeric value-graphic database 205. The database 123 is stored in a storage section of a general-purpose computer or the like.

The image generation section 201 receives information digitized by the A/D conversion section 120, correlates scanning positions of the electron beam 103 with pixels, and generates an SEM image. The image generation section 201 stores the generated SEM image to the image database 204.

The image parameter calculation section 202 generates a graph corresponding to the brightness ratios and structures of a portion selected from the SEM image acquired from the reference sample 108 irradiated with the electron beam 103. In this example, the brightness ratios are "brightness of pattern portions/brightness of their neighboring portion." The graph is for example "a graph that represents a relationship between depths and brightness ratios," "a graph that represents a relationship between aspect ratios and brightness ratios," or the like. The image parameter calculation section 202 stores numeric values of the brightness ratios, values that represent the structures of the concave portions, and graphs to the numeric value-graphic database 205.

In addition, the image parameter calculation section 202 calculates brightness ratios (brightness of pattern portions/brightness of their neighboring portions) from an SEM image acquired from the sample 109, including concave portions (observation target portions) to be actually observed, irradiated with the electron beam 103.

The determination section 203 compares information such as an SEM image and brightness ratios of the sample 109 with information stored in the image database 204 and the numeric value-graphic database 205 and extracts difference information. When there is a difference, the determination section 203 determines that the observation target portion of the sample 109 has a defect. In addition, when there is a difference, treatment time may be adjusted correspondingly to the difference so as to evaluate the conditions.

Figure 3A:
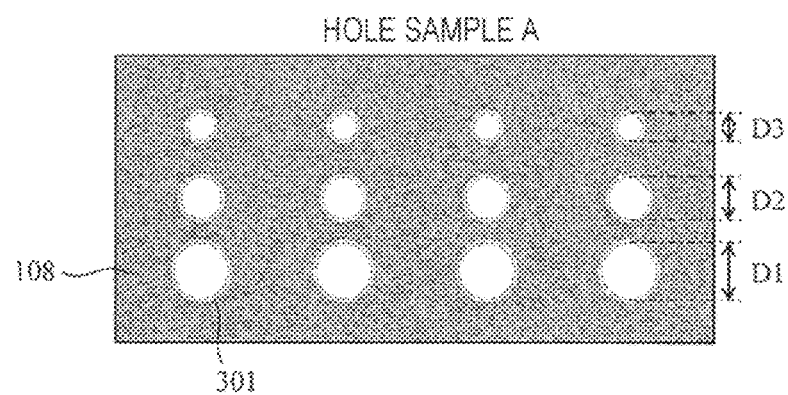
FIG. 3A is a bird eye's view showing an example of a hole sample A (reference sample).
Figure 3B:
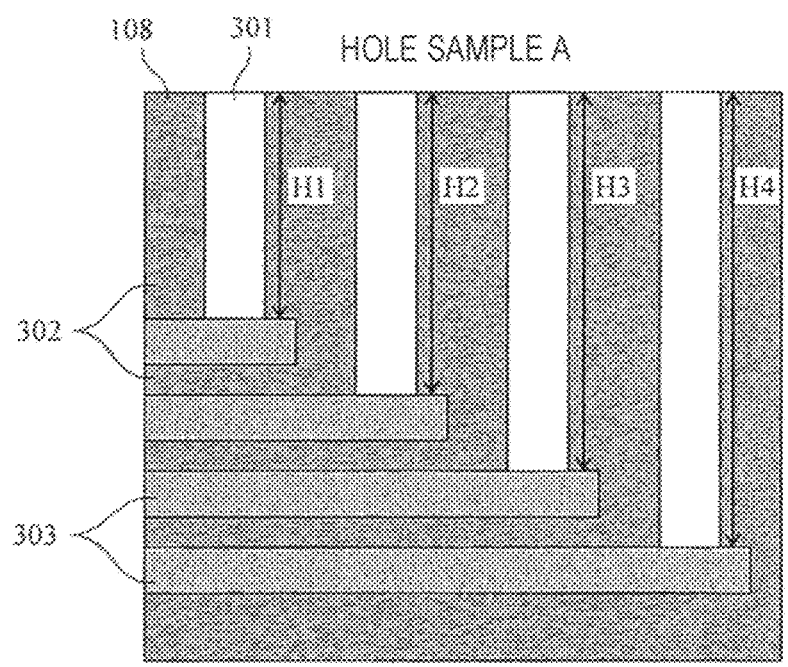
FIG. 3B is a diagram showing a cross-sectional structure as an example of the hole sample A (reference sample).

Next, a process for creating the database 123 will be described. For example, the reference sample 108 that imitates a structure of a three-dimensional laminate device 108 is used. FIG. 3A and FIG. 3B show an example of the reference sample 108. Here, a hole sample A which is an imitation of a structure of a three-dimensional laminate device is taken as an example. FIG. 3A is a bird eye's view of the hole sample A, and FIG. 3B is a cross-sectional structure of the hole sample A.

The hole sample A has a laminate structure of oxide film layers 302 and wiring layers 303. The wiring layers 303 are formed in a step shape so that they have different lengths. Holes 301 are etched in the laminate structure. Since the wiring layers 303 are stopper films, the holes 301 have different, depths (H1, H2, H3, and H4). In addition, the holes 301 have different diameters (D1, D2, and D3). In this example, the depths of the hole sample A have a relationship of H1<H2<H3<H4. The diameters of the hole sample A have a relationship of D1>D2>D3.

When the diameters of the holes 301 and the film thicknesses of the oxide film layers 302 and the wiring layers 303 are changed, samples having different aspect ratios can be prepared. The wiring layers 303 are made from various materials such as metal films and nitride films. As described above, the pattern sizes, depths, and material of the reference sample 108 are known.

Figure 4A:
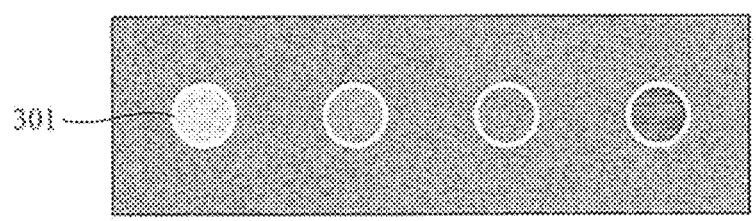
FIG. 4A is an example of an SEM image of a reference sample.
Figure 4B:
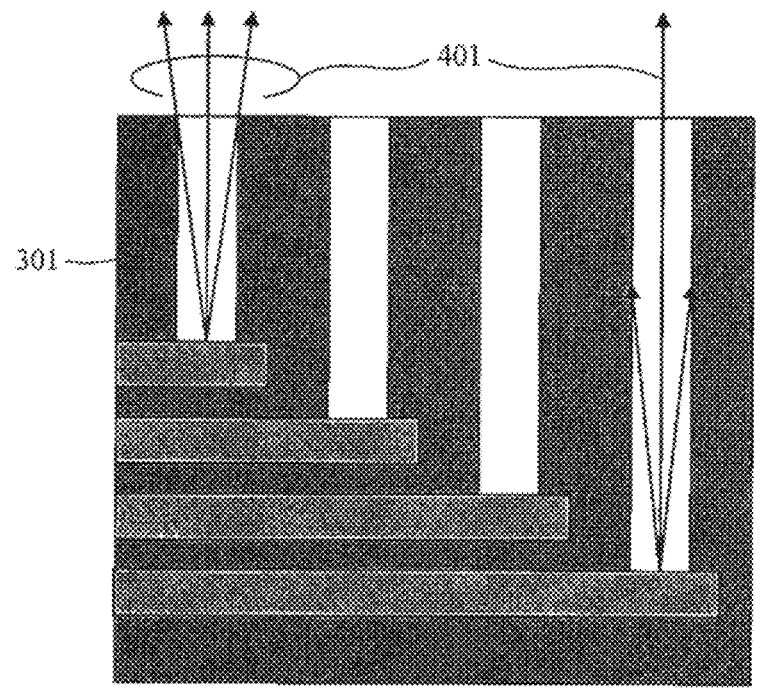
FIG. 4B is an example of behavior of secondary charged particles when a reference sample is scanned with an electron beam.

FIG. 4A is an example of an SEM image acquired from the reference sample 108 scanned with the electron beam 103. FIG. 4B is an example of behavior of secondary charged particles that are generated when the reference sample 108 is scanned with the electron beam 103. In the example shown in FIG. 4A and FIG. 4B, only the holes 301 having the same diameter are extracted.

As shown in FIG. 4B, according to the present embodiment, since an electron beam is used at a high acceleration voltage, primary electrons reach the bottoms of the holes 301. As a result, secondary charged particles 401 are emitted from the holes 301. In this example, the high acceleration voltage is 5 kV or greater. However, since part of secondary charged particles 401 are shielded by side wall portions of the hole patterns, the secondary charged particles 401 do not reach the detectors 110 and 111. Signals of the secondary charged particles detected by the detectors 110 and 111 decrease corresponding to the depths of the patterns.

Thus, the brightness of SEM images generated by the image generation section 201 depends on the depths as shown in FIG. 4A. Likewise, when the sizes of the opening portions of the holes 301 are changed, since the signals of the secondary charged particles increase or decrease depending on the sizes of the opening portions, the brightness of the hole patterns varies.

Figure 5A:
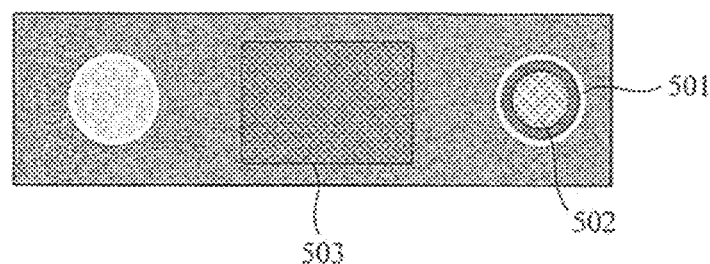
FIG. 5A is a diagram describing a method for calculating brightness ratios (contrast ratios) and a brightness fluctuation using an SEM image shown in FIG. 4A.

Next, a method for calculating brightness ratios and brightness fluctuations of the hole sample A will be described. FIG. 5A shows an example of the method for calculating the brightness ratios and brightness fluctuations of the SEM image shown in FIG. 4A. FIG. 5A is an enlarged view of part of FIG. 4A. The calculation method is not limited to the following method.

As described above, brightness of holes depends on their depth. A range in which average brightness of a bottom portion of a hole 501 is acquired is represented by reference numeral 502. A range in which average brightness of a plane portion of the hole sample A is acquired is represented by reference numeral 503. In the case of a lower structure, since the brightness fluctuation of the range 503 becomes large, the range 503 is preferred to represent a region in which brightness is stable. Assuming that the average brightness of the ranges 502 and 503 is represented respectively by Bb and Bt, a contrast ratio (Ca) of the hole 501 can be acquired according to the following formula.

Contrast ratio of hole (Ca)=average brightness of bottom portion of hole (Bb)/average brightness of plane portion (Bt)  Formula 1

To consider data fluctuation, images of the same hole may be acquired and their average value and dispersion value may be calculated. The calculation method for the fluctuation is not limited to the foregoing method. According to Formula (1), contrast ratios of all images are acquired. The image parameter calculation section 202 acquires images of all holes, calculates contrast ratios, and then generates a graph from the calculated data.

FIG. 5B is an example of a graph showing a relationship between depths and brightness ratios (Ca) of the hole sample A. FIG. 5B shows a data sequence 504 of a hole having diameter D1 and a data sequence 505 of a hole having diameter D2. A fluctuation range of the data sequence 504 acquired in the foregoing process is represented by reference numeral 506. SEM images of the hole sample A are stored in the image database 204 of the database 123 by the image generation section 201. Numeric values of the brightness ratios, numeric values of the brightness fluctuation, and graphs are stored in the numeric value-graphic database 205. Although FIG. 5B shows a graph that represents the relationship of the depths and the brightness ratios (Ca) of the hole sample A, the present invention is not limited to such a graph. Alternatively, a graph that represents a relationship between aspect ratios and brightness ratios (Ca) of the hole sample A may be generated.

To generate such a graph, a high acceleration voltage of 5 kV or greater is used. A high acceleration voltage that allows depths to be proportional to brightness ratios or aspect ratio to be proportional to brightness ratios is preferred to be used. When depths are proportional to brightness ratios, the depths can be easily estimated from the brightness ratios. As a result, the defect determination accuracy is improved.

The present invention is not limited to such a graph, which represents a proportional relation of depths and brightness ratios or that of aspect ratios and brightness ratios. For example, the graph may represent a polynomial function such as a linear function, an exponential function, or a logarithmic function.

Figure 6:
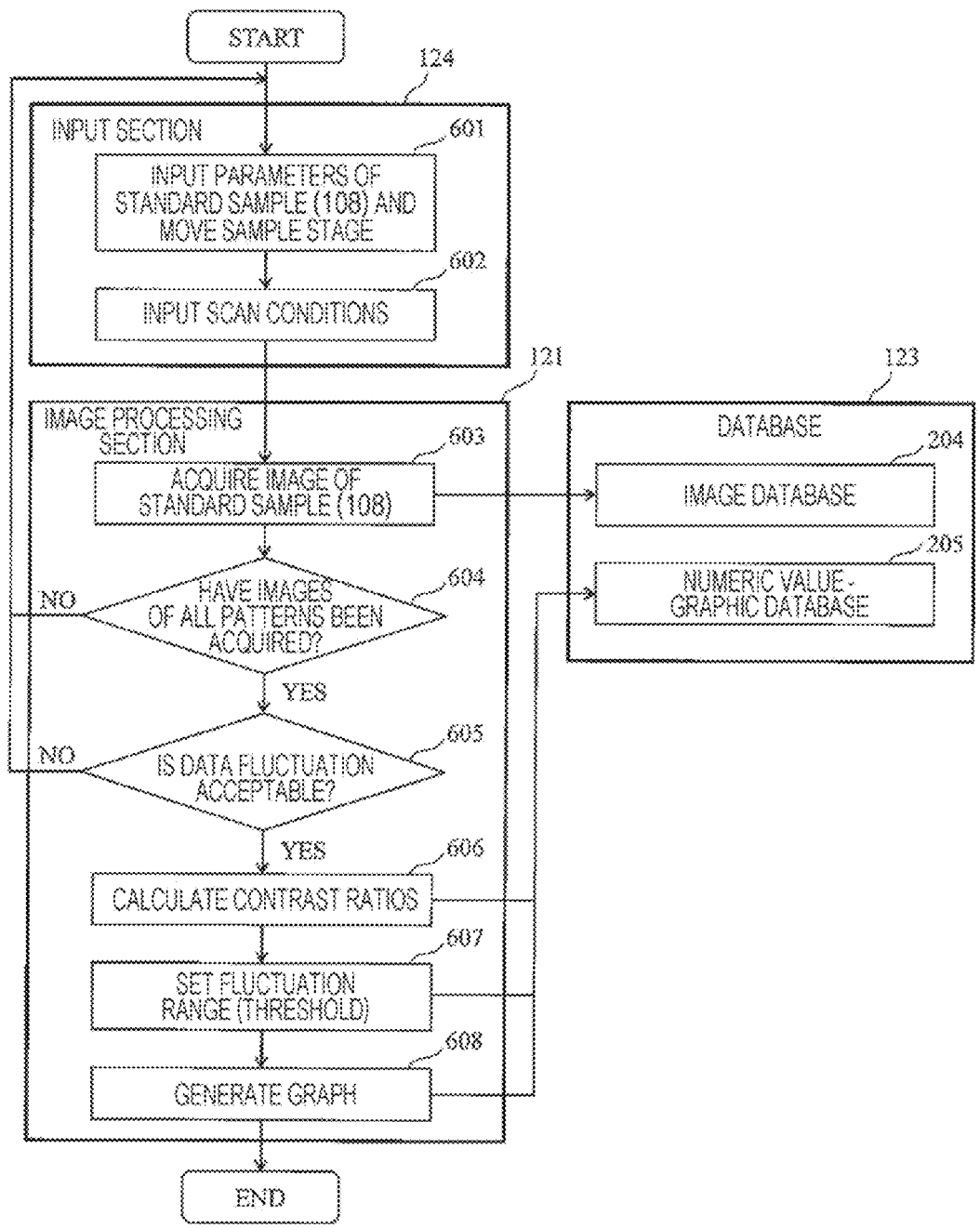
FIG. 6 is a flow chart of a process for generating a graph from a reference sample.

Next, a process for generating a graph from the reference sample 108 will be described. FIG. 6 is a flow chart showing a process for generating a graph from a reference sample. In this case, the reference sample 108 is a sample having concave portions whose structure is known.

The operator inputs parameters of the reference sample 108 through the input section 124 (at 601). After the parameters are input, the sample stage 101 is moved to an image acquisition position of the reference sample 108.

The parameters that are input include sample information, coordinate information of image acquisition positions of the sample, and coordinate information and range information of pattern portions and their neighboring portions necessary for acquiring brightness ratios. "Sample information" includes information of layouts and patterns (concave portions, trenches, and the like) (including coordinate information) of the reference sample 108, information of depths of the patterns, and information of sizes and structures (aspect ratios, and the like) of the patterns. "Coordinate information of image acquisition positions of sample" is coordinate information of image acquisition positions of the reference sample 108. "Coordinate information and range information of pattern portions and their neighboring portions necessary for acquiring brightness ratios" includes coordinate information and range information of part of the pattern portions and their neighboring portions. "Coordinate information and range information of pattern portions and their neighboring portions necessary for acquiring brightness ratios" may be input in advance at step 601. Alternatively, these information may be designated on the screen after an image is acquired at step 603.

Next, SEM imaging conditions (conditions such as an acceleration voltage) necessary for acquiring an image of the reference sample 108 at the image acquisition position is input through the input section 124 (at 602). The reference sample 108 is scanned according to the imaging conditions that have been input. An SEM image of the reference sample 108 is generated by the image generation section 201 of the image processing section 121 (at 603). The image generation section 201 registers the generated image to the image database 204.

The scanning electron microscope acquires SEM images of all patterns formed in the reference sample 108 (at 604). When SEM images of all the patterns have been acquired (at 604), the flow proceeds to step 605. Otherwise, the flow returns to step 601.

In consideration of fluctuations of SEM images, a plurality of SEM images is acquired for each pattern of the reference sample 108 (at 605). When a plurality of SEM images have been acquired for the same patterns, the flow proceeds to step 606. Otherwise, the flow returns to step 601.

When a recipe is created, input parameters for a plurality of patterns are set in advance so that a plurality of SEM images of the same patterns is acquired. As a result, a plurality of SEM images of a plurality of patterns can be automatically acquired. In this case, the determination process at steps 604 and 605 can be omitted.

Thereafter, the image parameter calculation section 202 of the image processing section 121 calculates contrast ratios (brightness of pattern portions/brightness of their neighboring portions) (at 606). The image parameter calculation section 202 selects a position at which a contrast ratio is calculated from an SEM image as shown in FIG. 5A and calculates the contrast ratio according to Formula 1.

Thereafter, the image parameter calculation section 202 of the image processing section 121 calculates a fluctuation range (threshold) of the brightness ratios based on a plurality of SEM images of the same pattern (at 607). Thereafter, the image parameter calculation section 202 generates a graph that represents a relationship between depths or aspect ratios and brightness ratios of the reference sample 108 (at 608). The graph may be generated according to an approximation process fox generating a straight line or a curved line with data of a group of a plurality of points. Thereafter, the image parameter calculation section 202 registers numeric values of the brightness ratios, numeric values of the brightness fluctuations, and graphs to the numeric value-graphic database 205. Now, the creation flow of the database 123 is completed.

Note that graphs may not be generated. In this case, the image parameter calculation section 202 generate only data that is information representing a relationship between depths and brightness ratios or a relationship between aspect ratios and brightness ratios. Brightness ratios corresponding to depths or aspect ratios may be defined as numeric values.

Figure 7A:
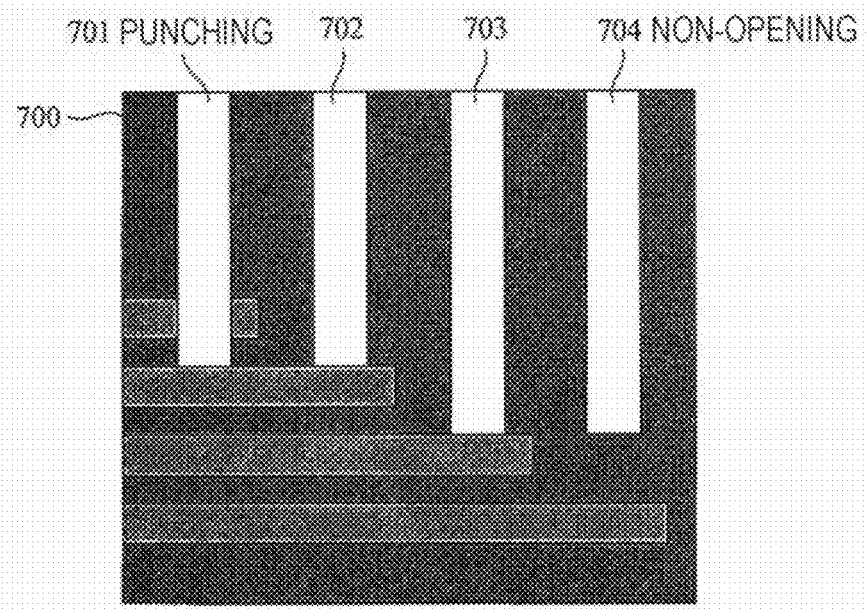
FIG. 7A is a diagram describing defects that may actually occur in a hole etching treatment.

Next, a defect detection process in a hole treatment for a three-dimensional laminate device will be described. FIG. 7A shows an imitation of defects that likely occur in hole etching treatment for a sample 700 having a structure of a three-dimensional laminate device. Target depths of individual holes of the sample 700 are known for a user who designs and manufactures the sample. In this treatment, since holes having different depths are simultaneously etched, a punching defect 701 that pierces a lower layer stopper film occurs in a hole whose target depth is small. In addition, a non-opening defect 704 may occur in a hole whose target depth is large.

Figure 7B:
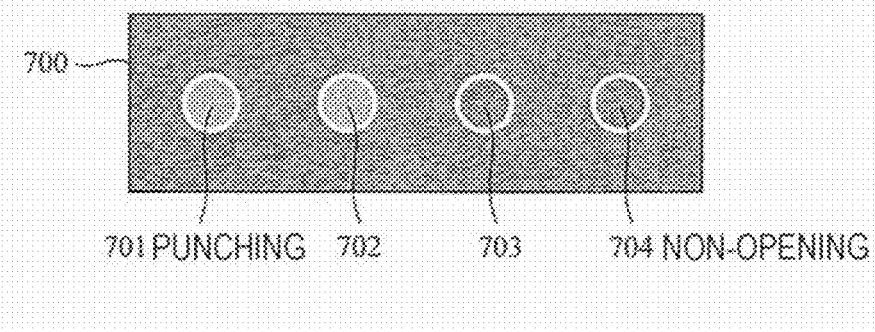
FIG. 7B is an example of an SEM image of a structure shown in FIG. 7A.

FIG. 7B is an example of an image of which the structure shown in FIG. 7A is observed by the SEM. Brightness of the punching defect 701 is nearly the same as that of a hole 702 formed on the right of the punching defect 701. Likewise, brightness of the non-opening defect 704 is nearly the same as that of a hole 703 formed on the left of the non-opening defect 704.

Contrast ratios of the individual holes shown in FIG. 7A and FIG. 7B are calculated according to Formula (1). FIG. 7C shows an example of a comparison of the contrast ratios calculated for the individual holes in the image shown in FIG. 7B with the data sequence 504 and the fluctuation range 506, shown in FIG. 5B, registered in the numeric value-graphic database 205. A graph, shown in FIG. 7C, retrieved from the numeric value-graphic database 205 is generated from an image acquired from the reference sample 108 observed under the same conditions (acceleration voltage) as the image shown in FIG. 7B.

With respect to a contrast ratio 705 when the punching defect 701 occurs, since the hole depth increases, the detected signal decreases, and thus, brightness of the hole decrease. As a result, a contrast ratio of the hole and its neighboring portion also decreases. On the other hand, with respect to a contrast ratio 706 when the non opening defect 704 occurs, the detected signal increases as the hole depth decreases. As a result, a contrast ratio of the hole and its neighboring portion also increases.

When a fluctuation range is used as a threshold, since the contrast ratios 705 and 706 deviate from the data sequence 504 registered in the numeric value-graphic database 205, a defect is presumed to occur. According to the present embodiment, the determination section 203 calculates differences between the contrast ratios 705 and 706 and the data sequence 504 so as to determine whether hole defects occur. This determination result denotes that etching conditions (treatment conditions) of the hole etching treatment are inadequate. Thus, when a hole defect is detected, it can be determined whether or not the etching conditions of the hole etching treatment are adequate.

When the determination section 203 correlates the contrast ratio 706 with that of the data sequence 504, the determination section 203 can acquire a depth 707 of the hole in which the non-opening defect 704 occurs. As a result, a depth of a hole in which a defect occurs can be estimated.

When the determination section 203 determines whether the contrast ratios 705 and 706 are greater than the data sequence 504, the determination section 203 may acquire a type of a defect. As described above, when the determination section 203 determines whether the contrast ratios 705 and 706 deviate from the data sequence 504 upward or downward, the determination section 203 may determine whether a punching defect or a non-opening defect occurs.

Figure 8:
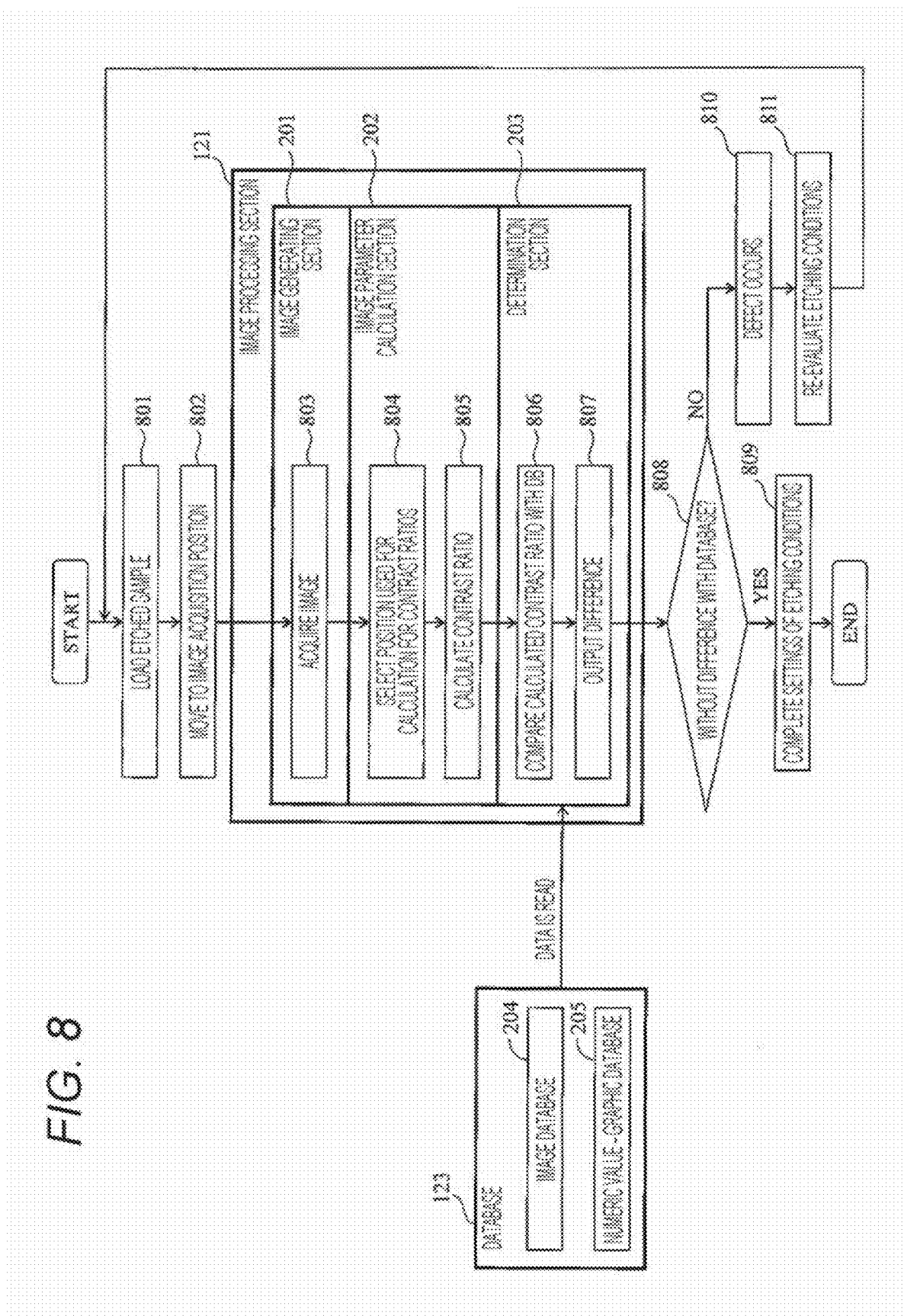
FIG. 8 is a flow chart of a process for detecting defects in a hole treatment for a three-dimensional laminate device.

Next, with reference to a graph that represents a relationship between depths and brightness ratios, a process for detecting a defect in a hole treatment for a three-dimensional laminate device and determining etching conditions will be described. FIG. 8 is a flow chart showing a process for detecting a defect in a hole treatment for a three-dimensional laminate device.

First, parameters are input through the input section 124. As described above, the parameters are sample information, coordinate information of image acquisition positions of a sample, and coordinate information and range information of pattern portions and their neighboring portions necessary for acquiring brightness ratios, and the like. In this example, parameters for the sample 109 to be actually observed are input. In addition, imaging conditions (such as acceleration voltage) SEM are also input through the input section 124. Thereafter, the following process is executed.

Thereafter, an etched wafer sample is loaded as the sample 109 to the sample stage 101 (at 801). After the wafer sample is loaded, an image acquisition position is moved to a position of a wafer sample having the same structure as the reference sample 108 (at 802).

The wafer sample is scanned at the image acquisition position with the electron beam 103 so that the image generation section 201 acquires an SEM image (at 803). The image parameter calculation section 202 selects a pattern portion (hole or trench) and its neighboring portion from the acquired SEM image (at 804). Thereafter, the image parameter calculation section 202 calculates a contrast ratio corresponding to the selected range (at 805).

Thereafter, the determination section 203 retrieves a graph that represents a relationship between depths and brightness ratios or a relationship between aspect ratios and brightness ratios from the database 123 (at 806). The graph retrieved from the database 123 is a graph generated from an image acquired from the reference sample 108 observed in the same imaging conditions (acceleration voltage). The determination section 203 compares the retrieved graph with the calculated contrast ratio (at 806). Thereafter, the determination section 203 outputs a difference between the retrieved graph and the calculated contrast ratio (at 807).

Thereafter, the determination section 203 determines whether or not the difference that is output is within a predetermined range (at 808). For example, when the difference is within the fluctuation range (at 506 shown in FIG. 5), the determination section 203 determines, that no defect occurs, and the flow proceeds to step 809. When the flow proceeds to step 809, settings of the etching conditions are completed.

In contrast, when the difference exceeds the fluctuation range, the determination section 203 determines that a defect occurs (at 810). Thereafter, the operator re-evaluates the etching conditions (at 811). A wafer sample is prepared in the re-evaluated etching conditions, and the process is repeated from step 801 once again. Steps 801 to 808 are repeated until no defect is detected.

Since a variable range of acceleration voltages in a conventional SEM wafer inspection unit is narrow, neither primary electrons reach bottoms of holes of a three-dimensional device, nor secondary electrons reach a detector. In addition, conventional analyzing unit that uses a substrate current cannot detect a substrate current depending on a lower layer structure or a residual film thickness of bottoms of holes of a three-dimensional device. Thus, conventionally, since a sample needs to be fractured so as to analyze its cross-section, this method not only takes time, but also requires many analysis points.

According to the present embodiment, a scanning electron microscope that can irradiate a bottom portion of a three-dimensional device with the electron beam 103 at a high acceleration voltage is used. In addition, the reference sample 108 in which holes or trenches having known sizes/depths are formed is prepared. Patterns having a plurality of depths and sizes (holes, trenches, and the like) are laid out on the reference sample 108. The reference sample 108 is observed at a high acceleration voltage. With images acquired from signals of the secondary electrons or reflected electrons, the database 123 is created. After the sample is treated, it is observed in the same imaging conditions (acceleration voltage) as the reference sample 108 is observed. When the graph retrieved from the database 123 and the brightness ratio of the sample are compared, the treatment result of the three-dimensional device can be determined. Thus, the treatment result of a sample having a complex and deep structure such as a three-dimensional device can be determined. According to the present embodiment, TAT necessary to acquire adequate etching conditions is improved in comparison with a conventional analyzing technique in which a sample is fractured. As a result, the present invention can contribute to early improvement of yield.

[Second Embodiment]

Next, a structure that has an image processing section 121 and a database 123 and that optimizes etching time (treatment conditions) will be described. FIG. 9A and FIG. 9B show an example of an reference sample 108 that is used in the present embodiment. According to the present embodiment, a hole sample B imitates a structure of a three-dimensional laminate device. The hole sample B has a plurality of holes whose diameter is the same. The hole sample B is etched for different etching times so that holes having different depths are formed.

According to the present embodiment, with the hole sample B as the reference sample 108, data that is stored in an image database 204 and a numeric value-graphic database 205 in the database 123 is created. A process for generating a graph from the reference sample 108 is the same as that shown in FIG. 6.

FIG. 9A is an SEM image of the hole sample B. FIG. 9B is a diagram showing a cross-sectional structure of the hole sample B. The hole sample B includes for example a reference hole group 901 and a hole group 902 that are etched so that the reference hole group 901 has a depth reaching an etching stop layer 910 and a hole group 902 having a depth less than that of the reference hole group 901 by setting etching time for the reference hole group 902 shorter than that for the hole group 901. As shown in FIG. 9A, SEM images acquired from the reference hole group 901 and the hole group 902 irradiated with an electron beam 103 show that since they differ in depth, brightness of bottom portions of the reference hole group 901 differs from that of the hole group 902.

Figure 9C:
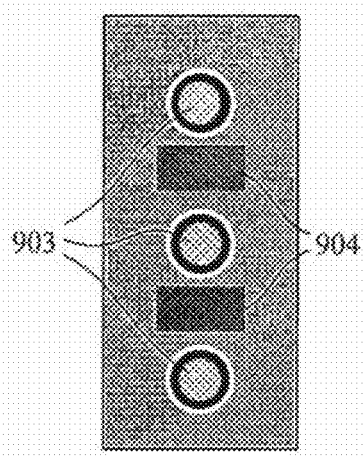
FIG. 9C is an enlarged view of part of FIG. 9A.

FIG. 9C is an enlarged view of part of FIG. 9A. Average brightness Bb is acquired from brightness of bottom portions 903 of holes having the same size. In addition, average brightness Bt of a front surface portion of the sample is acquired from front surface portions 904. Like the first embodiment, contrast ratios (Ca) of holes are acquired from average bright Bb and average brightness Bt according to Formula (1). A fluctuation of the contrast ratios (Ca) is acquired from a standard deviation. The fluctuation may be calculated from other than the standard deviation.

Figure 9D:
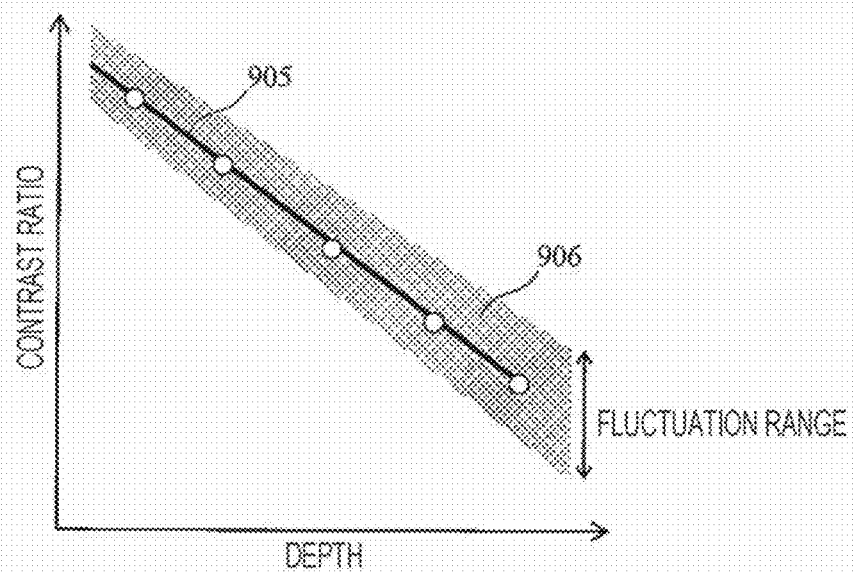
FIG. 9D is an example of a graph generated from an SEM image of the hole sample B (reference sample).

The contrast ratios (Ca) of the holes formed in the hole sample B are calculated. A graph is generated from Bb, Bt, Ca, and fluctuation that have been acquired. FIG. 9D is an example of a graph generated from SEM images of the hole sample B. Values of a graph 905 and a fluctuation range 906 are stored in a numeric value-graphic database 205 of a database 123. In addition, the SEM images of the hole sample B are stored in an image database 204 of the database 123.

Next, a process for optimizing etching time will be described. This process is the same as that shown in FIG. 8.

Figure 10A:
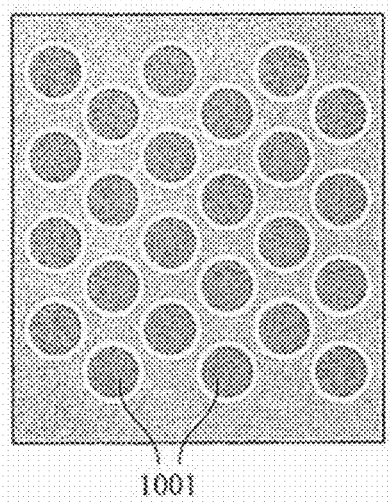
FIG. 10A is an example of an SEM image of holes treated for etching time T1.
Figure 10B:
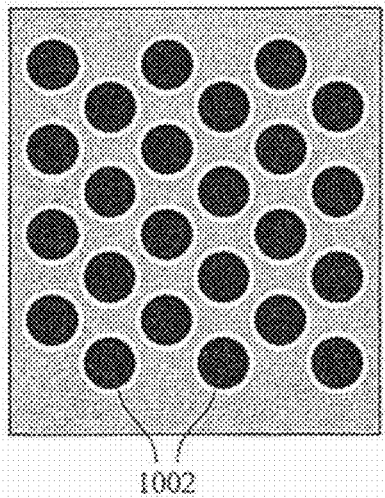
FIG. 10B is an example of an SEM image of holes treated for etching time T2.

FIG. 10A and FIG. 10B are SEM images of wafers having the same target depth that are etched for etching times T1 and T2 are that, are generated by the scanning electron microscope. It is assumed that holes 1001 shown in FIG. 10A are etched for etching time T1 and holes 1002 shown in FIG. 10B are etched for etching time T2. In addition, it is assumed that the target depth of the present embodiment is the same as the depth of the holes of the reference hole group 901 shown in FIG. 9B. The imaging conditions of the SEM images according to the present embodiment are the same as those shown in FIG. 9A. The wafers shown in FIG. 10A and FIG. 10B are samples 109 processed as shown in FIG. 8. After step 804 shown in FIG. 8, the following process is performed.

An image parameter calculation section 202 decides positions at which brightness of patterns of bottom portions of the holes 1001 and 1002 and front surface portions is calculated as shown in FIG. 9C. Thereafter, the image parameter calculation section 202 calculates contrast ratios according to Formula (1).

A determination section 203 retrieves a graph from the numeric value-graphic database 205. FIG. 10C is an example of a graph generated from an SEM image shown in FIG. 9A. The determination section 203 plots contrast ratios 1003 and 1004 shown in FIG. 10A and FIG. 10B on the graph shown in FIG. 10C.

The target depth of the wafer shown in FIG. 10A is the same as that shown in FIG. 10B. Thus, values on the X axis of the graph shown in FIG. 10C are the same. The contrast ratio 1003 calculated from the SEM image of the hole 1001 is sufficiently higher than a graph 1005 and a fluctuation range 1006. The determination section 203 extrapolates the contrast ratio 1003 in the x direction and acquires a depth 1007 of a point that comes in contact with the graph 1005 as the depth of the holes 1001.

On the other hand, the contrast ratio 1004 calculated from the SEM image of holes 1002 is plotted in the fluctuation range 1006 of the graph 1005. Thus, the holes 1002 are presumed to reach the target depth. Optimal etching time is presumed to be T2.

According to the present embodiment, when information acquired from the SEM image of the sample 109 to be evaluated is compared with the graph generated from the reference sample 108 (the hole sample B) etched for different etching times, optimum etching time can be decided. Conventionally, a sample was fractured so as to observe its cross-section. However, according to the present embodiment, etching time can be optimized without necessity of observing a cross-section of a sample. As a result, setting time of etching conditions can be shortened. As a result, TAT can be improved.

[Third Embodiment]

Figure 11:
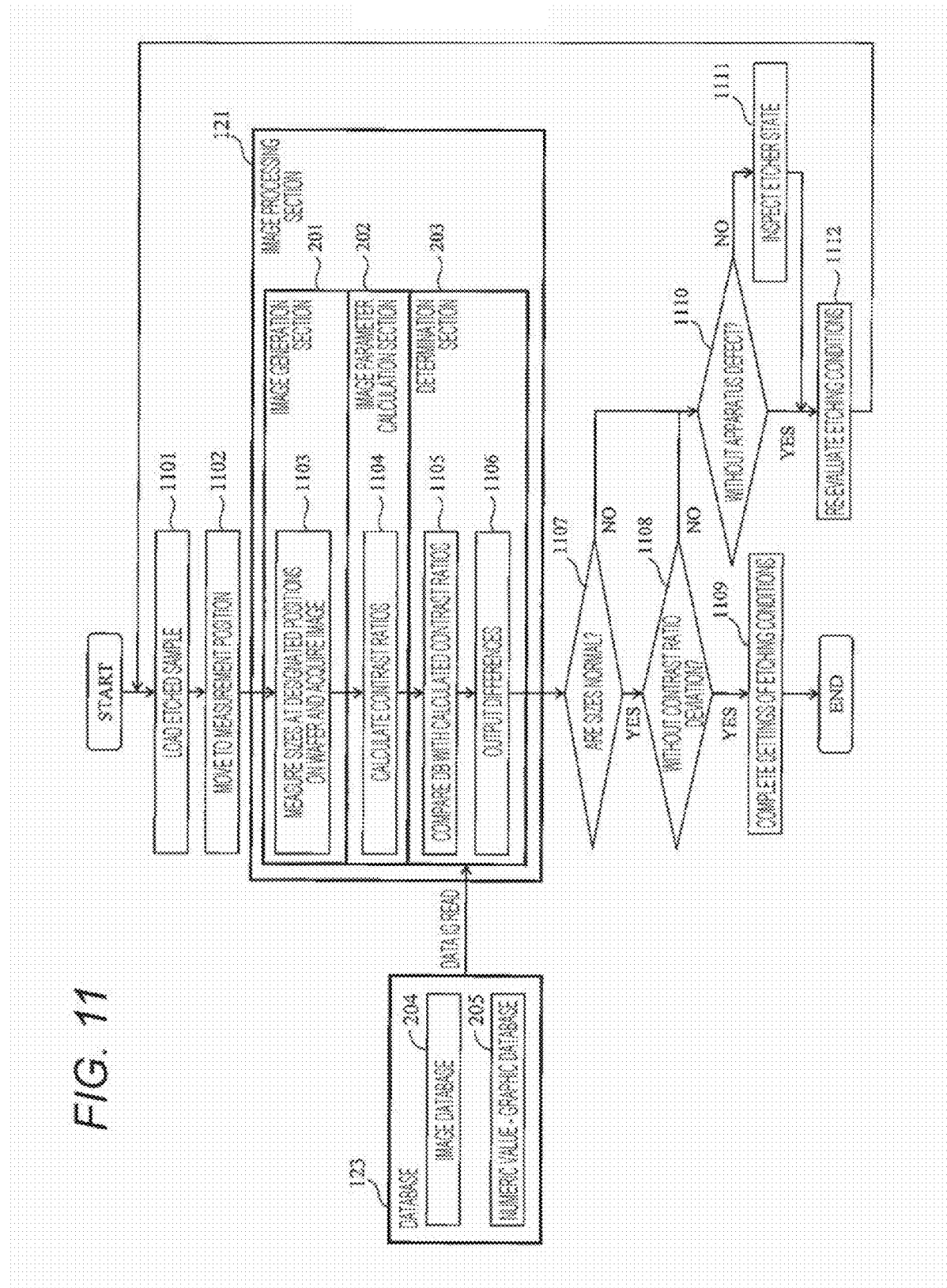
FIG. 11 is a flow chart when an inspection is performed with an SEM measurement instrument.

Next, an embodiment in which an SEM measurement instrument, having a pattern size measurement function is provided with an image processing section 121 and a database 123 will be described. FIG. 11 is a flow chart showing an inspection process implemented by the SEM measurement instrument.

First, parameters are input through an input section 124. As described above, the parameters are sample information, coordinate information of image acquisition positions of a sample, coordinate information and range information of pattern portions and their neighboring portions necessary for acquiring brightness ratios, and the like. According to the present embodiment, parameters for a sample 109 that is a wafer sample that has been etched are input. In addition, imaging conditions for an SEM (conditions such as acceleration voltage) are input through the input section 124. Thereafter, the following process is implemented.

Next, the sample 109 is loaded on a sample stage 101 (at 1101). After the wafer sample is loaded, a measurement position is moved to a designated position on the wafer (at 1102).

The designated point of the wafer is scanned with an electron beam 103. An image generation section acquires an SEM image and measures a size of the designated point (at 1103). For the acquired SEM image, as described above, an image parameter calculation section 202 selects pattern portions and their neighboring portions on the wafer sample. Thereafter, the image parameter calculation section 202 calculates contrast ratios corresponding to the selected range (at 1104).

Thereafter, a determination section 203 retrieves a graph that represents a relationship between depths and brightness ratios or a relationship between aspect ratios and brightness ratios from a database 123. Thereafter, the determination section 203 compares the retrieved graph with the calculated contrast ratios (at 1105). Thereafter, the determination section 203 outputs differences between the graph and the calculated contrast ratios (at 1106).

FIG. 12A shows a map that represents differences of contrast ratios of individual chips. A map 1201 is displayed on a screen of a monitor 128. The map 1201 represents contrast ratios of a plurality of designated points on a semiconductor wafer.

The map 1201 represents chips 1202 having normal contrasts, chips 1203 having slightly abnormal contrasts, chips 1204 having critically abnormal contrasts. These chips are displayed in different colors and different shades depending on differences with a reference sample 108. FIG. 12B shows another example of differences of contrast ratios of individual chips. A screen shown in FIG. 12B displays sizes and contrasts corresponding to coordinates of individual chips.

Thereafter, the determination section 203 determines whether or not sizes are abnormal (at 1107) and whether or not contrast ratios are abnormal (at 1108). When neither the sizes nor the contrast ratios are abnormal, the determination section 203 determines that settings of etching conditions are completed (at 1109). Thereafter, the sample is handed over to the next process.

When the sizes or the contrast ratios are abnormal, the flow proceeds to step 1110. When the sizes or the contrast ratios are abnormal, settings of etching conditions are likely insufficient or the etching unit is likely abnormal. Thus, it is determined whether or not the etching unit normally operates (at 1110). When the etching unit is abnormal, the unit is inspected (for etcher state) (at 1111). Thereafter, the etching conditions are re-evaluated (at 1112), and the flow returns to step 1101. When the unit is not abnormal at step 1110, the etching conditions are re-evaluated (at 1112), and the flow returns to step 1101.

According to the present embodiment, the reference sample 108 is observed by the scanning electron microscope so that a relationship between depths or aspect ratios and contrast ratios (=brightness of pattern portions/brightness of their neighboring portions) stored in the database 123 in advance. Images of a semiconductor wafer having the same structure as the reference sample 108 are acquired in the same imaging conditions as the database 123 is created. Contrast ratios of the acquired images and data stored in the database 123 are compared. Differences with the database 123 are output. As a result, the pattern treatment result of the semiconductor wafer can be evaluated.

The present embodiment can be applied to a mass production of three-dimensional semiconductor devices having a deep structure. Thus, the present embodiment can contribute to improvement of yield of semiconductor devices. In particular, when the three-dimensional devices are inspected based on evaluation of contrasts while their sizes are controlled in a mass production line, apparatus's abnormalities and defects can be detected in an early stage and thereby TAT can be improved.

[Fourth Embodiment]

Figure 13A:
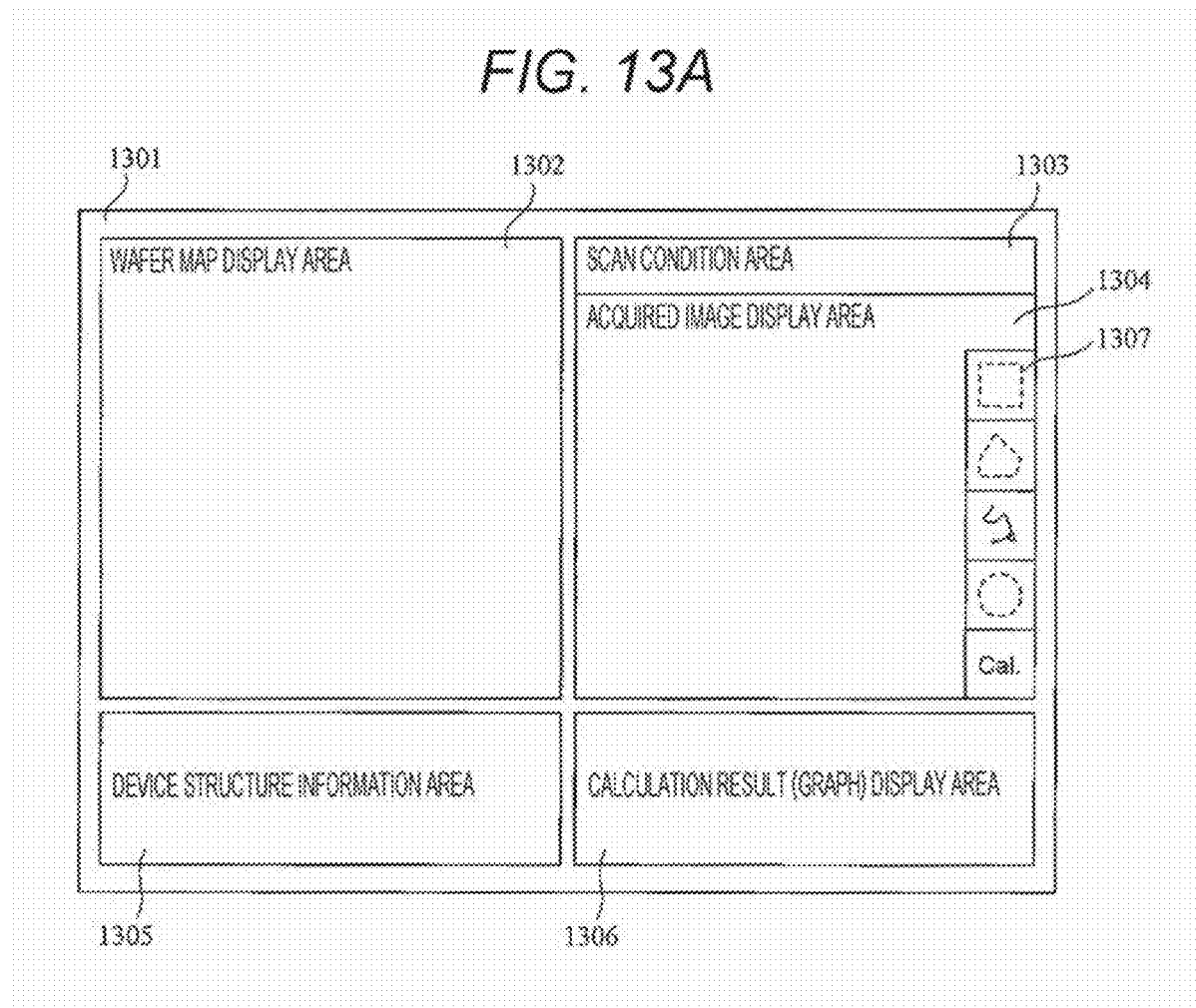
FIG. 13A is an example of a screen displayed on a monitor.

Next, a screen displayed on a monitor 128 according to each of the foregoing embodiments will be described. FIG. 13A is an example of a screen displayed on the monitor 128.

A screen 1301 includes a wafer map display area 1302, a scan condition area 1303, an acquired image display area 1304, a device structure information area 1305, a calculation result (graph) display area 1306, and a tool box 1307.

The wafer map display area 1302 displays chips being imaged or a reference sample. The wafer map display area 1302 displays a map of differences that have been determined (a map shown in FIG. 12A).

The scan condition area 1303 displays imaging conditions and the like of an SEM. The acquired image display area 1304 displays acquired SEM images. A range of pattern portions and a range of their neighboring portions that are used to calculate contrast ratios may be designated on an SEM image displayed on the acquired image display area 1304. In this case, with buttons in the tool box 1307, ranges of a square, a polygon, a circle, and the like can be designated on an SEM image displayed on the acquired image display area 1304.

The device structure information area 1305 displays information of a device structure of the sample 109 to be observed. The information of the device structure is input through the input section 124. When the information of the device structure of the sample 109 to be observed is input to the device structure information area 1305, information of the reference sample 108 corresponding to the sample is output.

The calculation result (graph) display area 1306 displays a calculation result and a graph of contrast ratios. The calculation result (graph) display area 1306 displays for example a graph shown in FIG. 7C or FIG. 10C. Alternatively, the calculation result (graph) display area 1306 may display a list of numeric values instead of a graph. For example, a list shown in FIG. 12B may be displayed.

Figure 13B:
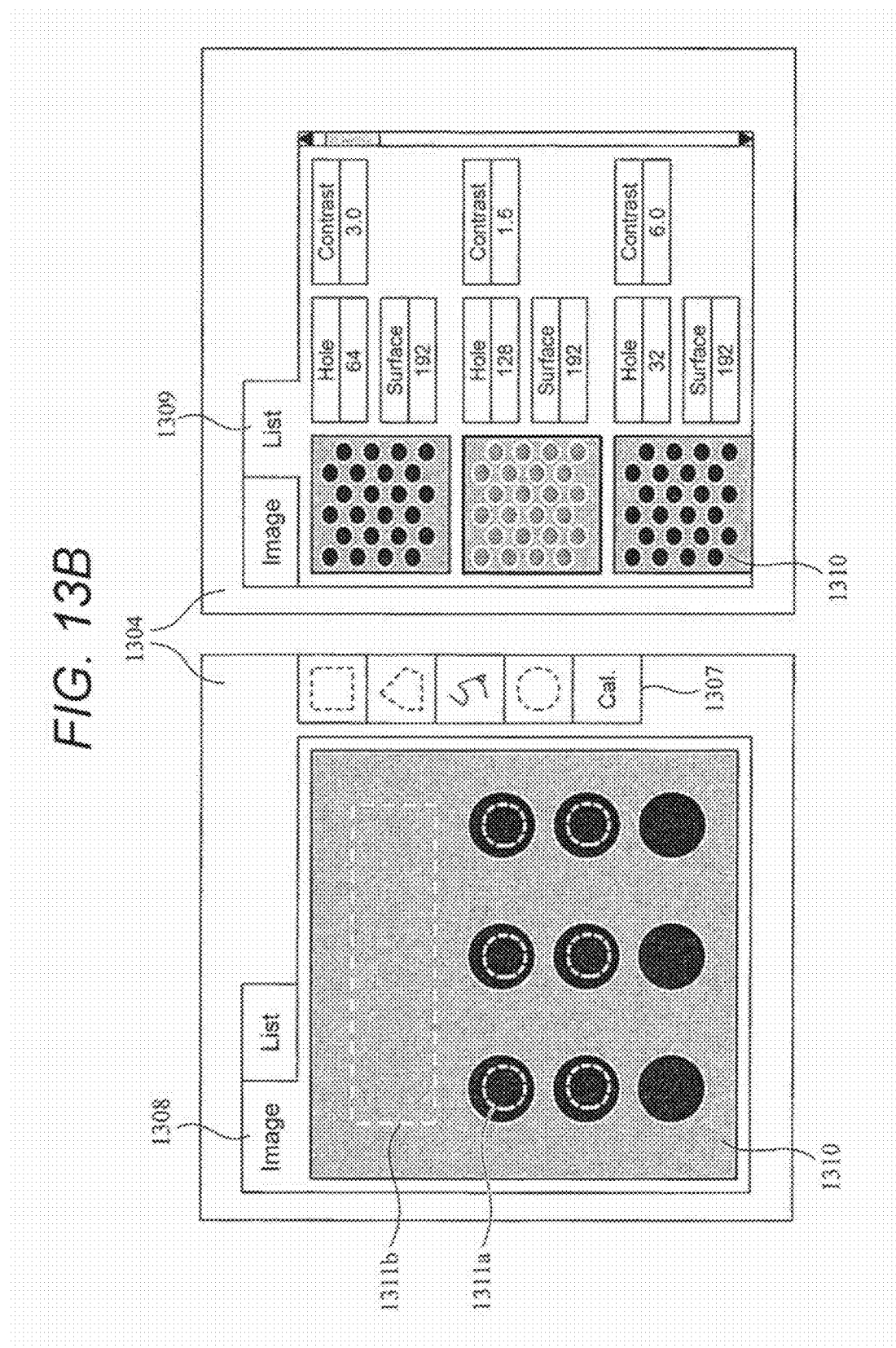
FIG. 13B is an enlarged view of an acquired image display area shown in FIG. 13A.

FIG. 13B is an enlarged view of the acquired image display area 1304. The acquired image display area 1304 includes an Image tab 1308 and a List tab 1309. A left side drawing of FIG. 13 shows a screen that appears when the Image tab 1308 is pressed. A right side drawing of FIG. 13 shows a screen that appears when the List tab 1309 is pressed.

The screen corresponding to the Image tab 1308 displays an acquired SEM image 1310. A pattern portion's range 1311$a$ and a neighboring portion's range 1311$b$ used to calculate contrast ratios are designated on the SEM image 1310 with the tool box 1307.

The screen corresponding to the List tab 1309 displays thumbnail images of the acquired SEM images 1310. Beside the thumbnail images, brightness of pattern portions (for example holes), brightness of their neighboring portions, and contrast ratios of the corresponding SEM images are displayed.

FIG. 13C is an enlarged view of the device structure information area 1305. The device structure information area 1305 displays a box 1312 that is used to select a type of a pattern portion, a box 1313 used to select a surface structure of a sample, a box 1314 used to select a bottom structure of a pattern portion of a sample, a box 1315 used to select a type of a size (diameter or width), a box 1316 used to select a type of a size (depth or height), a search button 1317, and a search result display area 1318. The operator can input appropriate parameters through the input section 124.

A database 123 stores information that correlates information of a structure of a sample with a reference sample 108. After information of the boxes 1312 to 1316 is input, when the search button 1317 is pressed, information of the reference sample 108 is displayed in the search result display area 1318.

The present invention is not limited to the foregoing embodiments, and includes various modifications of these embodiments. The foregoing embodiments describe the present invention in details so that it can be easily understood, and are not limited to those that have all the structures that have been described. In addition, a part of the structure of one embodiment may be substituted with the structure of another embodiment. Alternatively, the structure of one embodiment may be added to the structure of another embodiment. A part of the structure of each embodiment may be added to, subtracted from, and/or substituted with the structure of another embodiment.

With respect to a point of view of determination of whether or not a defect occurs or support for optimum treatment conditions, at least the monitor (display section) 128 may be provided instead of the determination section 203 so as to display information retrieved from the database 123 and brightness ratios calculated from the sample 109. For example, brightness ratios calculated from the sample 109 are plotted on a graph. In this case, with reference to a graph or the like on the monitor 128, the operator can determine occurrence of a defect or optimum treatment conditions without necessity of causing the determination section 203 shown in FIG. 8 to implement the process. When a fluctuation range is also displayed along with a graph on the monitor 128, determination time can be further shortened.

According to the foregoing embodiments, with one graph, occurrence a defect or optimum treatment conditions are determined. Alternatively, they may be determined with a plurality of graphs. The database 123 stores graphs corresponding to a plurality of acceleration voltages. The scanning electron microscope acquires images corresponding to the individual acceleration voltages. The determination section 203 may acquire differences of brightness ratios on images acquired corresponding to the individual acceleration voltages so as to determine occurrence of a defect in a sample or optimum treatment conditions. When these determinations are conducted with images acquired in a plurality of acceleration conditions, accuracies of these determinations can be improved.

As described above, these embodiments may be implemented with hardware of an integrated circuit that is designed for part or all of their structures. Alternatively, the present invention may be implemented with program codes of software that accomplish functions of the embodiments. In this case, a non-transitory computer readable medium that stores program codes may be provided to an information processing unit (computer). The information processing unit (or CPU) reads the program codes from the non-transitory computer readable medium. The non-transitory computer readable medium includes for example a flexible disc, a CD-ROM, a DVD-ROM, a hard disk, an optical disc, a magneto-optical disc, a CD-R, a magnetic tape, a non-volatile memory card, and a ROM.

The program codes may be supplied from one of various types of transitory computer readable media to the information processing unit. The transitory computer readable media include an electric signal, an optical signal, and an electromagnetic wave. The transitory computer readable medium can supply a program to the information processing unit through a wire communication line, such as an electric cable or an optical fiber, or a radio communication line.

Control lines and information lines illustrated in the drawings are those necessary for describing the present invention. Thus, these drawings may not show all lines that are used in the product. In addition, all the structures may be mutually connected to each other.

REFERENCE SIGN LIST

101 sample stage
102 column
103 electron beam
104 electron source
105 condenser lens
106 deflection scanning coil
107 objective lens
108 reference sample
109 sample
109 observation target sample (wafer)
110, 111 detector
112 secondary charged particles
120 A/D conversion section
121 image processing section
122 control section
123 database
124 input section
125 electron optical system control section
126 high voltage power supply
127 stage control section
128 monitor (display section)
201 image generation section
202 image parameter calculation section (calculation section)
203 determination section
204 image database
205 numeric value-graphic database

The invention claimed is:

1. A sample observation apparatus, comprising:
   a charged particle optical column that irradiates a sample including an observation target portion that is a concave portion with a charged particle beam at an acceleration voltage;
   an image generation section that acquires an image including the observation target portion from a signal acquired with irradiation of the charged particle beam;
   a storage section that stores information representing a relationship between a brightness ratio of a concave portion and its neighboring portion of a reference sample that is irradiated with the charged particle beam at the acceleration voltage and a value that represents a structure of the concave portions of the reference sample;
   a calculation section that acquires a brightness ratio of the concave portion and its neighboring portion of the image; and
   a determination section that determines whether or not a defect occurs in the observation target portion based on the information that represents the relationship and the brightness ratio of the image.

2. The sample observation apparatus according to claim 1, wherein the determination section correlates the brightness ratio of the image with the brightness ratio of the information that represents the relationship to acquire the value that represents the structure of the concave portion of the observation target portion.

3. The sample observation apparatus according to claim 1, wherein the determination section determines whether the brightness ratio of the image is greater or smaller than the information that represents the relationship to determine a type of a defect of the observation target portion.

4. The sample observation apparatus according to claim 1, wherein the calculation section generates information that represents the relationship from an image acquired from irradiation of the charged particle beam at an acceleration voltage that causes the relationship between the brightness ratio and the value that represents the structure of the concave portion to become proportional.

5. The sample observation apparatus according to claim 1, wherein the reference sample has a plurality of concave portions having different widths and heights, and
   the calculation section generates the information that represents the relationship from an image acquired from the plurality of concave portions of the reference sample with irradiation of the charged particle beam at the acceleration voltage.

6. The sample observation apparatus according to claim 1, wherein the image generation section acquires a plurality of images of the concave portion of the reference sample, and
   the calculation section calculates a fluctuation of the brightness ratio from the plurality of images and stores the fluctuation of the brightness ratio to the storage section.

7. The sample observation apparatus according to claim 6, wherein when the fluctuation is within a range of the fluctuation of the brightness ratio, the calculation section determines that the observation target portion does not have a defect.

8. The sample observation apparatus according to claim 1, wherein the value that represents the structure of the concave portion of the reference sample is a depth of the concave portion or an aspect ratio of the concave portion.

9. The sample observation apparatus according to claim 1, further comprising:
a display section that displays the information that represents the relationship as a graph,
wherein the brightness ratio of the image is indicated on the graph.

10. The sample observation apparatus according to claim 1,
wherein the sample is a semiconductor wafer, and
the sample observation apparatus further comprise:
a display section that displays the brightness ratio at a plurality of designated points on the semiconductor wafer on the map.

11. The sample observation apparatus according to claim 1,
wherein the storage section stores the information that represents the relationship corresponding to a plurality of acceleration voltages,
the calculation section calculates a brightness ratio of the concave portion and the neighboring portion of each of images acquired at the plurality of acceleration voltages, and
the determination section acquires a difference with the brightness ratio of each of the images acquired at the plurality of acceleration voltages so as to determine whether the observation target portion has a defect.

12. A sample observation apparatus, comprising:
a charged particle optical column that irradiates a sample including an observation target portion that is a concave portion with a charged particle beam at an acceleration voltage;
an image generation section that acquires an image including the observation target portion from a signal acquired with irradiation of the charged particle beam;
a storage section that stores information representing a relationship between a brightness ratio of a concave portion and its neighboring portion of a reference sample that is irradiated with the charged particle beam at the acceleration voltage and a value that represents a structure of the concave portions of the reference sample;
a calculation section that acquires a brightness ratio of the concave portion and its neighboring portion of the image; and
a determination section that determines whether or not treatment conditions for the observation target portion are appropriate based on the information representing the relationship and the brightness ratio of the image.

13. The sample observation apparatus according to claim 12,
wherein the reference sample has a plurality of concave portions treated for different etching times, and
the calculation section generates information that represents the relationship with images acquired from the plurality of concave portions of the reference sample with irradiation of the charged particle beam at the acceleration voltage.

14. A sample observation apparatus, comprising:
a charged particle optical column that irradiates a sample including an observation target portion that is a concave portion with a charged particle beam at an acceleration voltage;
an image generation section that acquires an image including the observation target portion from a signal acquired with irradiation of the charged particle beam;
a storage section that stores information representing a relationship between a brightness ratio of a concave portion and its neighboring portion of a reference sample that is irradiated with the charged particle beam at the acceleration voltage and a value that represents a structure of the concave portions of the reference sample;
a calculation section that acquires a brightness ratio of the concave portion and its neighboring portion of the image; and
a display section that displays the information that represents the relationship as a graph,
wherein the brightness ratio of the image is indicated on the graph.

* * * * *